United States Patent [19]
Drechsel

[11] Patent Number: 5,599,390
[45] Date of Patent: Feb. 4, 1997

[54] APPARATUS FOR CRYSTAL PULLING

[75] Inventor: Dieter Drechsel, Bruchköbel, Germany

[73] Assignee: Leybold Aktiengesellschaft, Hanau, Germany

[21] Appl. No.: 751,318

[22] Filed: Aug. 28, 1991

[30] Foreign Application Priority Data

Jul. 4, 1991 [DE] Germany .................. 41 22 120.6

[51] Int. Cl.⁶ .................................................. C30B 35/00
[52] U.S. Cl. ............................................................ 117/208
[58] Field of Search .................................. 156/600, 617.1, 156/618.1; 422/249

[56] References Cited

U.S. PATENT DOCUMENTS 3,511,610  5/1970  Dohmen ............................ 422/249

FOREIGN PATENT DOCUMENTS 0389284  of 1990  European Pat. Off. ..

OTHER PUBLICATIONS

Leybold Application 45–100.2, "Crystal Growing"; May 2, 1989.

Primary Examiner—R. Bruce Breneman
Assistant Examiner—FeLisa Garrett
Attorney, Agent, or Firm— Felfe & Lynch

[57] ABSTRACT

A lock valve disposed between a pulling pot and a lock chamber is opened at the start of the pulling process and thereby uncovers a lock entrance for the crystal that is to be pulled, and together with a gasket closes the lock entrance after the end of the pulling process and thereby hermetically separates the pulling pot from the lock chamber. The gasket (9) is protected during the pulling of the crystal by a guard (15, 16) against the thermal radiation of the hot crystal.

4 Claims, 1 Drawing Sheet

APPARATUS FOR CRYSTAL PULLING

BACKGROUND OF THE INVENTION

The invention relates to an apparatus for crystal pulling, preferably from the melt, especially a monocrystal pulling apparatus, with a lock valve which is disposed between a pulling pot and a lock chamber. The valve is opened at the start of the pulling process thereby releasing a lock entrance for the crystal to be pulled. A closure together with a gasket closes the lock entrance after the pulling process has ended and thus hermetically separates the pulling pot from the lock chamber.

In the field of crystal growing a great number of different processes are known, such as crystal growing from the gaseous phase, from a solution, and from the melt. The various methods for growing crystals from the melt have achieved a leading position over other growing methods on account of its highly developed process technology and productivity.

Crucible processes of many different kinds are used in growing crystals from the melt. There is, for example, the so-called Kyropoulos process which is characterized by dipping a chilled seed crystal into the melt. Furthermore there is the so-called Czochralski process in which a crystal is pulled from the melt.

There is also the Bridgman process, which is characterized by a vertical lowering of a crucible in the temperature gradient. Lastly, there is vertical zone melting without crucibles.

The lock valve of the present invention is generally usable wherever it is important to protect one or more gaskets on the closure of a lock valve against the thermal radiation of the hot crystal during the crystal pulling process.

In Leybold's publication 45-100.02 entitled, "Crystal Growing," apparatus and methods are described for growing crystals from the melt.

The state of the art also includes the laid-open European patent application 0 389 2784, which describes a lock valve used in a monocrystal pulling apparatus between a main chamber and an upper pull chamber. The lock valve has a frame-like body, and a vertical connecting passage between the main chamber and the upper pull chamber.

The closure of the lock valve can be rotated about an axis and moved up and down by a shaft. There is a lever for turning the shaft on its axis. A drive means is furthermore provided which can move the shaft up and down. A horizontal arm mounted on the shaft bears the closure and holds it in the horizontal position. A flange surrounds an opening which forms the connecting passage between the main chamber and the upper pulling chamber.

The European patent application discloses an opening in the circular closure, by which a circular cylinder is formed. The flange described above has a circular margin that is directed vertically upward. The outside diameter of this margin is slightly smaller than the inside diameter of the circular cylinder. The circular cylinder of the closure, when the lock entrance is closed, is slipped, so to speak, over the circular margin of the flange. An annular gasket is disposed in a groove made in the outside wall of the margin of the flange. When the circular cylinder of the closure is slipped onto the closure this gasket comes in sliding contact with the inside wall of the circular cylinder of the closure.

Sliding gaskets require carefully prepared surfaces. In spite of the careful preparation of the friction surfaces, sliding gaskets have but a very limited life. This is especially true if, as in the present case, sliding gaskets are used in apparatus for pulling crystals from the melt, no grease or oil lubrication of the gasket may be practiced. For technical reasons the working atmosphere of the crystal pulling apparatus must remain free of grease and oil. The limited life of the gasket according to the European disclosure is therefore explained substantially by the severe shearing stress applied to the gasket.

SUMMARY OF THE INVENTION

The gasket of the closure is free of shearing stress during the closing action. The gasket is furthermore protected against the radiation from the hot crystal during the pulling process. In particular, burning of the gasket is avoided.

The gasket is only exposed to pressure without shear and without friction and is protected by a guard against the thermal radiation of the hot crystal during the pulling of the crystal.

In particular it is proposed that the closure be configured as a cover which when closed rests upon a preferably annular gasket, and that a wall element is disposed between the gasket and the lock entrance, and serves as a radiation guard for the gasket.

Provision can also be made for the wall element to be configured as a tube section which is formed on the pulling pot.

In is proposed especially that the wall element be a tube section which is formed on the pulling pot by boring.

Alternatively it is proposed that the wall element be configured as a tube section which is fastened to the pulling pot.

Preferably, provision can be made for welding the tube section onto the pulling pot.

DETAILED DESCRIPTION OF THE PREFERRED EMBODIMENT

Figure 1:
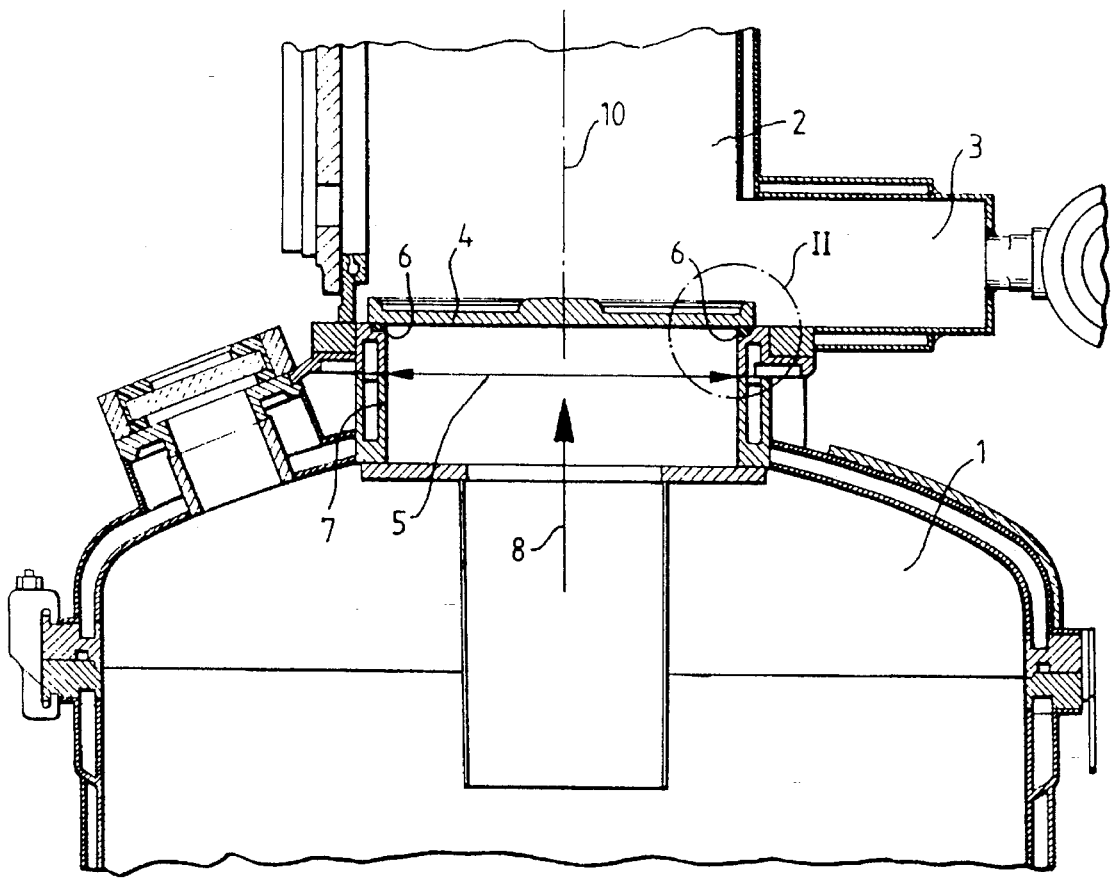
FIG. 1 is a section view showing the parts of a known monocrystal pulling apparatus that are adjacent to the lock valve.

The known monocrystal pulling apparatus of FIG. 1 has a pulling pot 1 and a lock chamber 2. The lock valve is disposed between the pulling pot and the lock chamber at position 3.

In its closed position the cover 4 rests on a gasket 6. The gasket is annular in shape and set in an annular groove in wall 7 around lock entrance 5.

Wall 7 is in the form of a short tube section through which, after removal of the cover 4, the crystal is pulled upward in the direction of arrow 8 into the lock chamber 2 during the pulling process.

In the state of the art in FIG. 1, while the crystal is being pulled the gasket 6 is exposed to the thermal radiation of the hot crystal. As mentioned in the introduction, this can cause the gasket to be burned.

Figure 2:
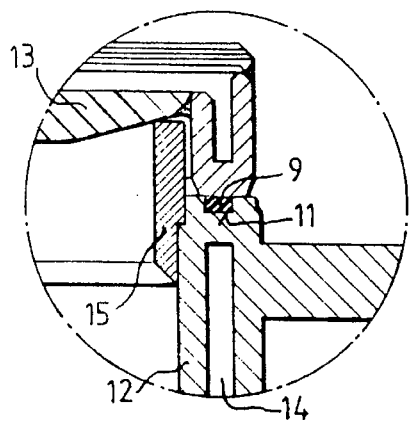
FIG. 2 is a partial section view of the lock closure according to the invention.

In FIG. 2 there is shown a modification of area II of FIG. 1 which is undertaken in accordance with the basic idea of the invention. Area II shows the gasket 9 and the adjacent components. The illustration at II is a mirror-image of the corresponding area of FIG. 1 on the other side of the central axis 10 of the monocrystal pulling apparatus.

The gasket 9 is held in a groove 11 milled in the face of tubular wall 12 which connects the pulling furnace with the lock chamber when the lock valve is open. The hot crystal is pulled through this tube section during the pulling process. The tube section is cooled by an internal water jacket 14. The cover 13 of the lock valve rests on the gasket 9.

In the embodiment represented in FIG. 2, a shield 15 is provided which protects the gasket 9 against the thermal radiation from the hot crystal. In FIG 2 this is configured as a tube section welded in place.

Figure 3:
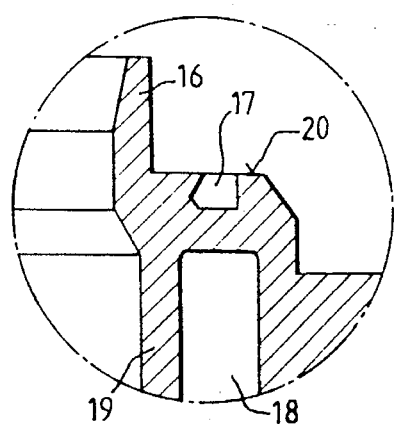
FIG. 3 is a partial section view of a second embodiment of lock closure according to a second embodiment of lock closure according to the invention.

In the subject of FIG. 3, the shield 16 is configured as an integrally formed tube section 16.

The tube section can be made by machining (turning) the tubular wall 19.

A groove 17 is made in the face 20 of wall 19 to accommodate the gasket, which is not represented. A water jacket 18 cools the wall 19 and adjacent components.

A comparison of the embodiments in FIGS. 2 and 3 with the subject matter of the above-named European patent disclosure document clearly shows that the gasket in accordance with the invention is not stressed by shear or by friction.

By means of the measures taken: protection against thermal radiation by a wall element and avoidance of shearing stress, a surprisingly great prolongation of the life of the gasket is achieved. Consequently a longer uninterrupted use of the monocrystal pulling apparatus is possible, which results in a considerable saving in manufacturing costs.

I claim:

1. Apparatus for pulling crystal from a melt, said apparatus being of the type comprising a pulling pot for containing said melt, an upper pull chamber, and a lock valve between said pot and said chamber, said lock valve comprising wall means defining a vertical connecting passage between the pulling pot and the upper pull chamber, said wall means having an upward facing surface surrounding a lock entrance, a closure which closes said lock entrance when crystal is not being pulled through said vertical connecting passage, gasket means which seals said closure against said upward facing surface when said lock entrance is closed, said gasket means being arranged to be exposed solely to pressure without shear stress and friction during opening and closing of said lock entrance, and shield means between said gasket means and said connecting passage, said shield means being fixed relative to said gasket means for shielding said gasket means from thermal radiation during pulling of said crystal from said melt.

2. Apparatus as in claim 1 wherein said gasket means and said shield means are fixed relative to said wall means.

3. Apparatus as in claim 2 wherein said shield means comprises a wall element upstanding relative said upward facing surface.

4. Apparatus as in claim 2 wherein said upward facing surface has a groove therein, said gasket means being a circular gasket seated in said groove.

* * * * *